United States Patent
Lee et al.

(10) Patent No.: US 10,022,746 B2
(45) Date of Patent: Jul. 17, 2018

(54) APPARATUS AND METHOD FOR TREATING A SUBSTRATE

(71) Applicant: Semes Co., Ltd., Cheonan-si, Chungcheongnam-do (KR)

(72) Inventors: Sul Lee, Incheon (KR); Young Hun Jung, Cheonan-si (KR); Jong Su Choi, Asan-si (KR)

(73) Assignee: Semes Co., Ltd., Chungcheongam-do (KR)

( * ) Notice: Subject to any disclaimer, the term of this patent is extended or adjusted under 35 U.S.C. 154(b) by 0 days.

(21) Appl. No.: 14/862,729

(22) Filed: Sep. 23, 2015

(65) Prior Publication Data

US 2016/0089686 A1 Mar. 31, 2016

(30) Foreign Application Priority Data

Sep. 30, 2014 (KR) .................. 10-2014-0131702

(51) Int. Cl.
  *B05D 1/00* (2006.01)
  *H01L 21/67* (2006.01)
  *B05D 1/02* (2006.01)

(52) U.S. Cl.
  CPC .............. *B05D 1/002* (2013.01); *B05D 1/02* (2013.01); *H01L 21/6708* (2013.01)

(58) Field of Classification Search
  None
  See application file for complete search history.

(56) References Cited

U.S. PATENT DOCUMENTS 6,805,769 B2 * 10/2004 Okuda ............... B08B 3/024
  134/113
7,998,308 B2 * 8/2011 Kaneko ............ H01L 21/67051
  134/119

(Continued)

FOREIGN PATENT DOCUMENTS

CN     1828840 A    9/2006
JP   2002170808 A   6/2002

(Continued)

OTHER PUBLICATIONS

Machine Generated English Translation of KR 10-2008-0059697. Published Jan. 6, 2010.*

*Primary Examiner* — Sylvia Macarthur
(74) *Attorney, Agent, or Firm* — Harness, Dickey & Pierce, P.L.C.

(57) ABSTRACT

In apparatus and method according to example embodiments of the inventive concept, a substrate may be treated using two or more treatment solutions. The substrate treating apparatus may include a treatment vessel providing a treatment space, a substrate supporting unit provided in the treatment vessel to support a substrate, and a solution supplying unit supplying a treatment solution on the substrate supported by the substrate supporting unit. The solution supplying unit may include an etching solution supplying nozzle supplying an etching solution on an edge region of the substrate supported by the substrate supporting unit and an etch prevention solution (EPS) supplying nozzle supplying an etch prevention solution on a center region of the substrate supported by the substrate supporting unit. Accordingly, it is possible to prevent the center region of the substrate from being dried.

5 Claims, 9 Drawing Sheets

(56) References Cited

U.S. PATENT DOCUMENTS

| | | | |
|---|---|---|---|
| 8,251,077 B2* | 8/2012 | Aratake | H01L 21/67051 134/148 |
| 8,439,051 B2* | 5/2013 | Matsumoto | C11D 11/0047 134/103.2 |
| 2003/0170988 A1* | 9/2003 | Izumi | B05B 7/066 438/689 |
| 2004/0187896 A1* | 9/2004 | Konishi | B08B 3/024 134/33 |
| 2007/0087456 A1* | 4/2007 | Hashizume | H01L 21/67051 438/6 |
| 2008/0017222 A1* | 1/2008 | Miya | H01L 21/67051 134/21 |
| 2008/0142054 A1* | 6/2008 | Eitoku | H01L 21/6708 134/30 |
| 2009/0038641 A1* | 2/2009 | Matsumoto | H01L 21/02087 134/6 |
| 2009/0241995 A1* | 10/2009 | Somervell | G03F 7/42 134/30 |
| 2010/0032097 A1* | 2/2010 | Ohashi | H01L 21/67034 156/345.55 |
| 2010/0112917 A1 | 5/2010 | Leighton et al. | |
| 2011/0130010 A1 | 6/2011 | Yamasaki et al. | |
| 2014/0000659 A1* | 1/2014 | Lee | H01L 21/02052 134/26 |
| 2016/0089686 A1* | 3/2016 | Lee | H01L 21/6708 216/92 |

FOREIGN PATENT DOCUMENTS

| | | |
|---|---|---|
| JP | 2002-208577 A | 7/2002 |
| JP | 2003-109936 A | 4/2003 |
| JP | 2003-318154 A | 11/2003 |
| KR | 100726015 B1 | 6/2007 |
| KR | 20100000266 A | 1/2010 |
| KR | 20140067892 A | 6/2014 |
| KR | 2014-0101947 A | 8/2014 |

\* cited by examiner

APPARATUS AND METHOD FOR TREATING A SUBSTRATE

CROSS-REFERENCE TO RELATED APPLICATIONS

This U.S. non-provisional patent application claims priority under 35 U.S.C. § 119 to Korean Patent Application No. 10-2014-0131702, filed on Sep. 30, 2014, in the Korean Intellectual Property Office, the entire contents of which are hereby incorporated by reference.

BACKGROUND OF THE INVENTION

Example embodiments of the inventive concept relate to apparatus and method for treating a substrate, and in particular, to apparatus and method for treating a substrate using two or more types of treatment solutions.

To fabricate a semiconductor device or a liquid crystal display device, it is necessary to perform several processes (such as photolithography, etching, ashing, ion-implantation, thin-film deposition, and cleaning processes) on a substrate. By performing the etching process on a thin layer (e.g., a metal, oxide, poly-silicon, or photoresist layer) formed on the substrate, it is possible to form patterns with desired shapes.

The etching process may be classified into two method; wet and dry etching method. In the case of the wet etching method, the substrate or the thin layer is etched using a treatment solution, and in the case of the dry etching method, the substrate or the thin layer is etched using plasma or ion beam.

Generally, the wet etching method may include a step of supplying an etching solution on a center region of a rotating substrate. Owing to a centrifugal force, the etching solution supplied on the center region of the substrate is spread on the entire region of the substrate. However, the etching process may suffer from non-uniformity in etch rate; for example, an under- or over-etched region may be formed on the substrate. In the case where the substrate is over-etched, an oxide layer may be formed on the over-etched region of the substrate.

Figure 1:
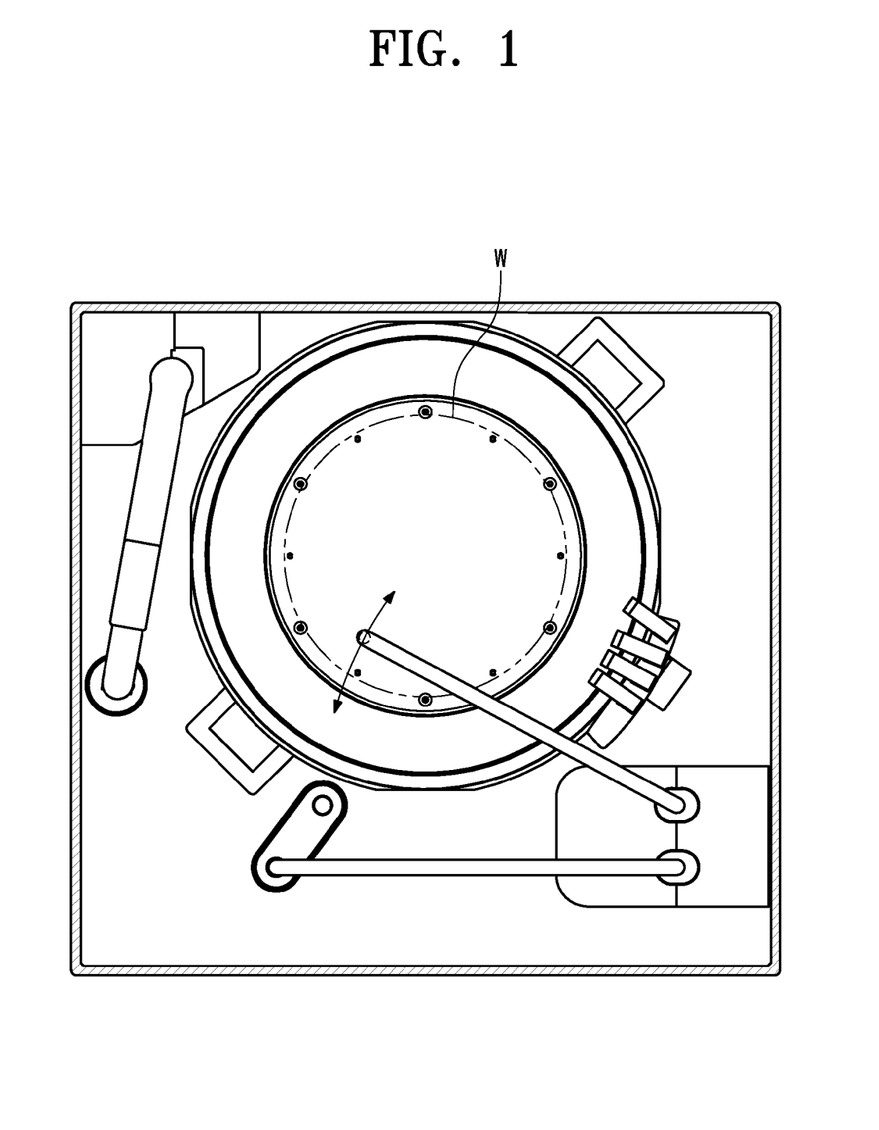
FIG. 1 is a plan view illustrating a conventional substrate treating apparatus.

To overcome this issue, referring to FIG. 1, an etching process may be further performed to etch an edge region of the substrate W; for example, an etching solution may be supplied on the edge region of the substrate W. However, during the process of etching the edge region, the center region of the substrate W may be dried, and this may lead to formation of damaged patterns. In addition, the etching solution supplied to the edge region of the substrate W may be partially scattered toward the center region of the substrate W, and this may lead to a process failure.

SUMMARY

Example embodiments of the inventive concept provide apparatus and method capable of preventing a center region of a substrate from being dried when an etching process is performed on an edge region of the substrate.

Other example embodiments of the inventive concept provide apparatus and method capable of preventing a center region of a substrate from being etched when an etching process is performed on an edge region of the substrate.

In apparatus and method according to example embodiments of the inventive concept, a substrate may be treated using two or more treatment solutions. The substrate treating apparatus may include a treatment vessel providing a treatment space, a substrate supporting unit provided in the treatment vessel to support a substrate, and a solution supplying unit supplying a treatment solution on the substrate supported by the substrate supporting unit. The solution supplying unit may include an etching solution supplying nozzle supplying an etching solution on an edge region of the substrate supported by the substrate supporting unit and an etch prevention solution (EPS) supplying nozzle supplying an etch prevention solution on a center region of the substrate supported by the substrate supporting unit.

In example embodiments, the solution supplying unit may further include a supporting arm supporting the etching solution supplying nozzle and the EPS supplying nozzle, a rotating axis supporting the supporting arm, and a driving unit rotating the rotating axis. The supporting arm may include a first arm coupled to the rotating axis, a longitudinal direction of the first arm being parallel to a specific direction, and a second arm coupled to the first arm, a longitudinal direction of the second arm being different from the specific direction, when viewed in a plan view. The etching solution supplying nozzle and the EPS supplying nozzle may be provided on the second arm. The second arm may be provided to have a plurality of connection ports allowing the etching solution supplying nozzle and the EPS supplying nozzle to be connected thereto, and the connection ports may be arranged along the longitudinal direction of the second arm. The second arm may be provided to be movable relative to the first arm.

In example embodiments, the solution supplying unit may further include a supporting arm supporting the etching solution supplying nozzle, a rotating axis supporting the supporting arm, and a driving unit rotating the rotating axis. The EPS supplying nozzle may be coupled to the treatment vessel to be unmovable relative to the treatment vessel.

In example embodiments, the solution supplying unit may further include a first supporting arm supporting the etching solution supplying nozzle, a first rotating axis supporting the first supporting arm, a first driving unit rotating the first rotating axis, a second supporting arm supporting the EPS supplying nozzle, a second rotating axis supporting the second supporting arm, and a second driving unit rotating the second rotating axis.

According to example embodiments of the inventive concept, a treating method of etching a surface of a substrate. The method may include supplying an etching solution on an edge region of the substrate through an etching solution supplying nozzle and supplying an etch prevention solution on a center region of the substrate through an etch prevention solution (EPS) supplying nozzle.

In example embodiments, the etching solution and the etch prevention solution may be supplied on the substrate at the same time. The etch prevention solution may be supplied on the substrate through the EPS supplying nozzle, and then, the etching solution may be supplied on the substrate through the etching solution supplying nozzle. During the supplying of the etching solution, the etch prevention solution may be continuously supplied on the substrate. Both of the etching solution supplying nozzle and the EPS supplying nozzle may be coupled to a supporting arm. A distance between the etching solution supplying nozzle and the EPS supplying nozzle may be substantially equal to a radius of the substrate. The etching solution supplying nozzle may be supported by a first arm and the EPS supplying nozzle may be supported by a second arm connected to the first arm, and the second arm may be configured to be movable relative to the first arm.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of method, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

For the sake of simplicity, the description that follows will refer to an example of the present embodiment in which a substrate is treated by a cleaning process including chemical treatment and rinse steps. However, example embodiments of the inventive concept are not limited to the cleaning process and may be applied to other processes (e.g., an etching, ashing, or developing process), in which a treatment solution is used to treat a substrate or wafer.

Hereinafter, example embodiments of the inventive concept will be described in more detail with reference to FIGS. 2 through 9.

Figure 2:
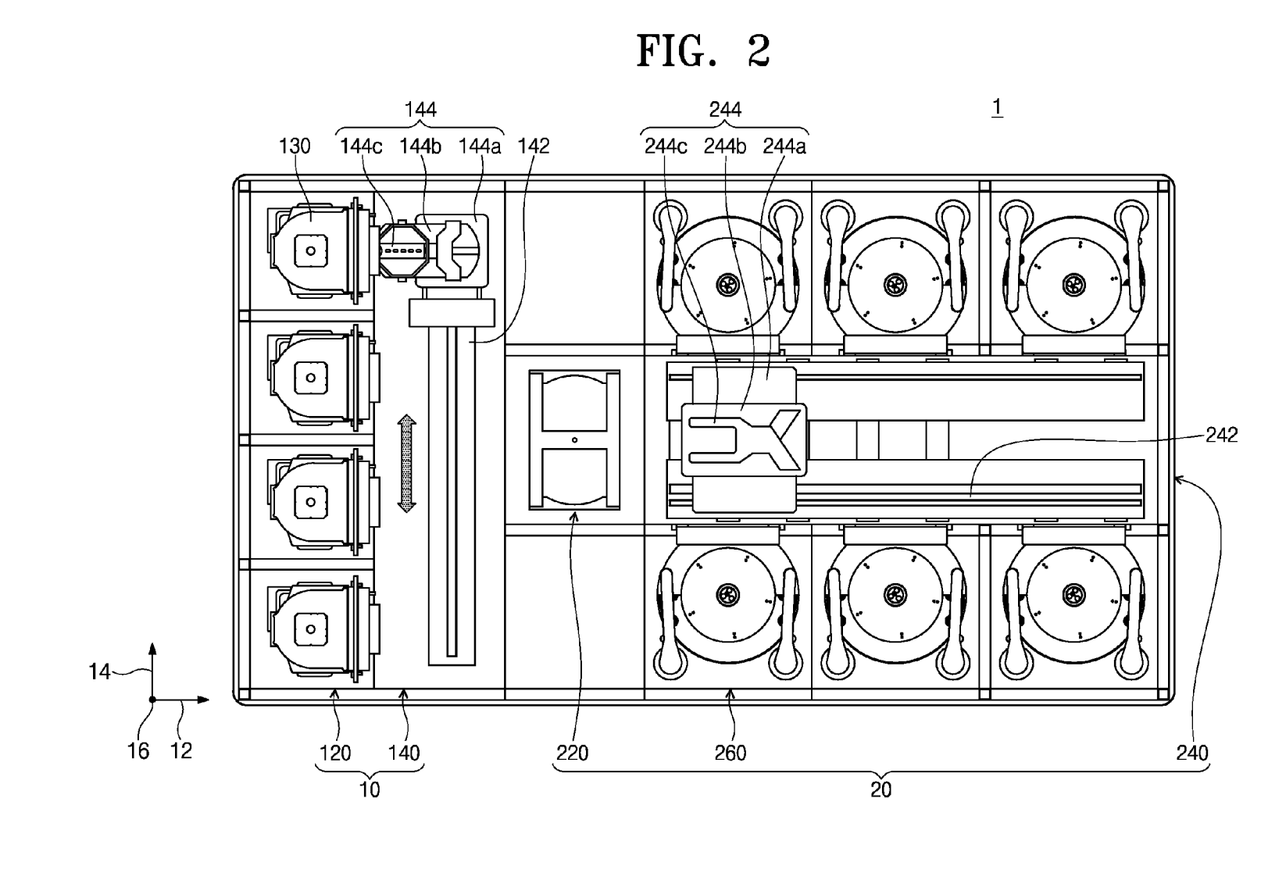
FIG. 2 is a plan view illustrating a substrate treating apparatus according to example embodiments of the inventive concept.

FIG. 2 is a plan view illustrating a substrate treating apparatus according to example embodiments of the inventive concept. Referring to FIG. 2, a substrate treating apparatus 1 may include an index module 10 and a process module 20. The index module 10 may include a load port 120 and a transfer frame 140. The load port 120, the transfer frame 140, and the process module 20 may be sequentially arranged in a row. Hereinafter, if the load port 120, the transfer frame 140, and the process module 20 are arranged along a first direction 12, when viewed in a top view, a direction perpendicular to the first direction 12 will be referred to as a second direction 14, and a direction normal to a plane including the first and second directions 12 and 14 will be referred to as a third direction 16.

A carrier 130 may be disposed on the load port 120 to contain a substrate or wafer W. In some embodiments, the index module 10 may include a plurality of load ports 120 arranged in the second direction 14. The number of the load ports 120 may be increased or decreased, depending on process efficiency and foot-print condition of the process module 20. The carrier 130 may have a plurality of slots (not shown), each of which is configured to store the wafers w in a direction parallel to the earth's ground. A front opening unified pod (FOUP) may be used as the carrier 130.

The process module 20 may include a buffer unit 220, a transfer chamber 240, and a process chamber 260. The transfer chamber 240 may be configured in such a way that its longitudinal direction is parallel to the first direction 12. The process chambers 260 may be disposed at both sides of the transfer chamber 240. At either side of the transfer chamber 240, the process chambers 260 may be symmetrically disposed with respect to the transfer chamber 240. A plurality of substrate processing units 260 may be provided at one side of the transfer chamber 240. Some of the process chambers 260 may be arranged in a longitudinal direction of the transfer chamber 240. In certain embodiments, the process chambers 260 may be disposed in such a way that some of them are stacked on top of each other. In other words, at one side of the transfer chamber 240, the process chambers 260 may be disposed to have an 'A×B' arrangement. Here, A represents the number of the process chambers 260 arranged in the first direction 12, and B represents the number of the process chamber 260 arranged in the third direction 16. For example, in the case where four or six process chambers are disposed at one side of the transfer chamber 240, the process chambers 260 may be disposed to have a '2×2' or '3×2' arrangement. The number of the process chambers 260 may be changed (e.g., increased or decreased). Alternatively, the process chamber 260 may be disposed at only one side of the transfer chamber 240. In certain embodiments, the process chamber 260 may be provided to have a single floor structure at one or both sides of the transfer chamber 240.

The buffer unit 220 may be provided between the transfer frame 140 and the transfer chamber 240. The buffer unit 220 may provide a space for temporally storing the substrate W, before the substrate W is transferred between the transfer chamber 240 and the transfer frame 140. The buffer unit 220 may be configured to have slots (not shown), on which the substrate W is disposed. In some embodiments, a plurality of slots (not shown) may be arranged spaced apart from each other in the third direction 16. The buffer unit 220 may be provided in such a way that sides facing the transfer frame 140 and the transfer chamber 240 are opened.

The transfer frame 140 may be configured to allow the substrate W to be transferred between the carrier 130 loaded on the load port 120 and the buffer unit 220. An index rail 142 and an index robot 144 may be provided in the transfer frame 140. The index rail 142 may be disposed to have a longitudinal direction parallel to the second direction 14. The index robot 144 may be disposed on the index rail 142 and may be moved, in a linear manner, along the index rail 142 or in the second direction 14. The index robot 144 may include a base 144a, a body 144b, and an index arm 144c. The base 144a may be disposed to be movable in a direction along the index rail 142. The body 144b may be coupled to the base 144a. The body 144b may be provided on the base 144a to be movable in the third direction 16. Furthermore, the body 144b may be provided to be rotatable about the base 144a. The index arm 144c may be coupled to the body 144b and may be configured to be movable in a forward and backward direction with respect to the body 144b. The index robot 144 may include a plurality of index arms 144c which can be operated in an independent manner. The index arms 144c may be stacked vertically (e.g., spaced apart from each other in the third direction 16). Some of the index arms 144c may be used to transfer the substrate W from the process module 20 to the carrier 130, and the others may be used to transfer the substrate W from the carrier 130 to the process module 20. This may make it possible to prevent particles, which may be produced from the substrate W before a substrate treating process (e.g., in steps of loading or unloading the substrate W using the index robot 144), from being attached to the substrate W after the substrate treating process.

The transfer chamber 240 may be configured to allow for the substrate W to be transferred between the buffer unit 220 and the process chamber 260 and between the process chambers 260. A guide rail 242 and a main robot 244 may be provided in the transfer chamber 240. The guide rail 242 may be provided to have a longitudinal direction parallel to the first direction 12. The main robot 244 may be disposed on the guide rail 242 and may be straightly moved in a direction parallel the guide rail 242 (e.g., in the first direction 12). The main robot 244 may include a base 244a, a body 244b, and a main arm 244c. The base 244a may be configured to be movable along the guide rail 242. The body 244b may be coupled to the base 244a. The body 244b may be provided on the base 244a to be movable in the third direction 16. Furthermore, the body 244b may be provided to be rotatable about the base 244a. The main arm 244c may be coupled to the body 244b and may be configured to be movable in a forward and backward direction with respect to the body 244b. The main robot 244 may include a plurality of main arms 244c which can be operated in an independent manner. The main arms 244c may be stacked vertically (e.g., spaced apart from each other in the third direction 16).

A substrate treating apparatus 300 may be provided in the process chamber 260, and in some embodiments, the substrate treating apparatus 300 may be configured to perform a cleaning process on the substrate W. A structure of the substrate treating apparatus 300 may be changed depending on a type of cleaning process. Alternatively, the substrate treating apparatus 300 of the process chambers 260 may be provided to have substantially the same structure. In certain embodiments, the process chambers 260 may be classified into a plurality of groups, which are different from each other in structure of the substrate treating apparatus 300, and each of which includes at least one substrate treating apparatus 300 having the same structure.

Figure 3:
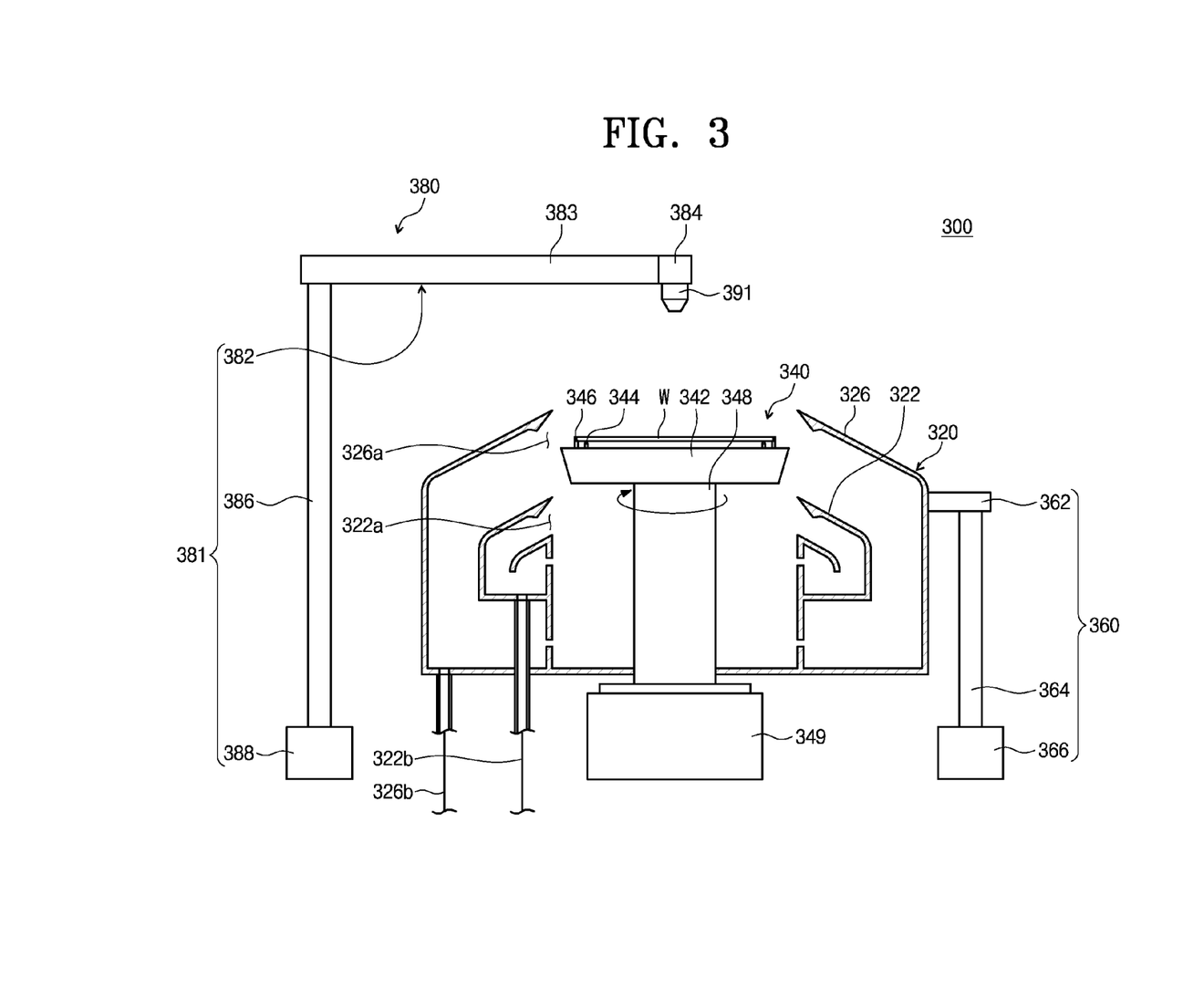
FIG. 3 is a sectional view illustrating the substrate treating apparatus of FIG. 2.

FIG. 3 is a sectional view illustrating the substrate treating apparatus of FIG. 2. Referring to FIG. 3, the substrate treating apparatus 300 may include a treatment vessel 320, a spin head 340, an elevating unit 360, and a solution supplying unit 380.

The treatment vessel 320 may be shaped like a top-open bucket. The treatment vessel 320 may include an inner collecting barrel 322 and an outer collecting barrel 326. Each of the collecting barrels 322 and 326 may be configured to selectively collect a corresponding one of treatment solutions to be used in the substrate treating process. The inner collecting barrel 322 may be provided to have a circular ring structure enclosing the spin head 340, and the outer collecting barrel 326 may be provided to have a circular ring structure enclosing the inner collecting barrel 326. An inner space of the inner collecting barrel 322 may serve as a first intake 322a, allowing a treatment solution to be injected into the inner collecting barrel 322. A space between the inner and outer collecting barrels 322 and 326 may serve as a second intake 326a, allowing the treatment solution to be injected into the outer collecting barrel 326. In some embodiments, the first and second intakes 322a and 326a may be positioned at different levels. The collection lines 322b and 326b may be connected to bottom surfaces of the collecting barrels 322 and 326, respectively. The treatment solution collected through the collecting barrels 322 and 326 may be delivered to an external treatment solution recycling apparatus (not shown) through the collection lines 322b and 326b and may be recycled.

During a substrate treating process, the spin head 340 may be configured to support and rotate the substrate W, thereby serving as a substrate supporting unit. The spin head 340 may include a body 342, a supporting pin 344, a chuck pin 346, and a support axis 348. The body 342 may be provided to have a circular top surface, when viewed in a plan view. The support axis 348 may be fixedly coupled to a bottom surface of the body 342, and a driving part 349 may be configured to rotate the support axis 348.

The spin head 340 may include a plurality of supporting pins 344. The supporting pins 344 may be provided spaced apart from each other by a specific space along an edge of a top surface of the body 342 and may have a shape protruding upward from the body 342. Taken as a whole, the supporting pins 344 may be disposed to form a circular ring-shaped arrangement. The supporting pins 344 may be provided to support an edge region of the bottom surface of the substrate W, and this may make it possible for the substrate W to be separated from the top surface of the body 342 by a predetermined distance.

The spin head 340 may include a plurality of chuck pins 346. The chuck pins 346 may be disposed farther away from a center of the body 342 than the supporting pins 344. The chuck pins 346 may be provided to protrude upward from the body 342. The chuck pins 346 may support a sidewall of the substrate W, and this may make it possible to prevent the substrate W from being deviated from its normal position in a lateral direction, when the spin head 340 is rotated. The chuck pins 346 may be configured in such a way that they are straightly moved in a radial direction of the body 342 (e.g., between waiting and supporting positions). The waiting position is farther away from the center of the body 342 than the supporting position. The chuck pin 346 may be located at the waiting position, when the substrate W is loaded or unloaded on the spin head 340, and the chuck pin 346 may be located at the supporting position, when a substrate treating process is performed on the substrate W. When the chuck pin 346 is located at the supporting position, it may be in contact with the sidewall of the substrate W.

The elevating unit 360 may be configured to allow the treatment vessel 320 to be straightly moved in a vertical direction. The vertical movement of the treatment vessel 320 may lead to a change in vertical position of the treatment vessel 320 relative to the spin head 340. The elevating unit 360 may include a bracket 362, a moving axis 364, and a driving unit 366. The bracket 362 may be fixedly connected to an outer surface of the treatment vessel 320, and moreover, it may also be fixedly connected to the moving axis 364 configured to be moved in a vertical direction by the driving unit 366. When the substrate W is loaded on or lifted from the spin head 340, the treatment vessel 320 may be moved in a downward direction, and thus, the spin head 340 may be protruded upward from the treatment vessel 320. In certain embodiments, a vertical position of the treatment vessel 320 may be controlled to selectively collect the treatment solution through a predetermined one of the collecting barrels 322 and 326, depending on a type of treatment solution to be used in a substrate treating process. In some embodiments, the elevating unit 360 may be configured to move the spin head 340 in a vertical direction.

Figure 5:
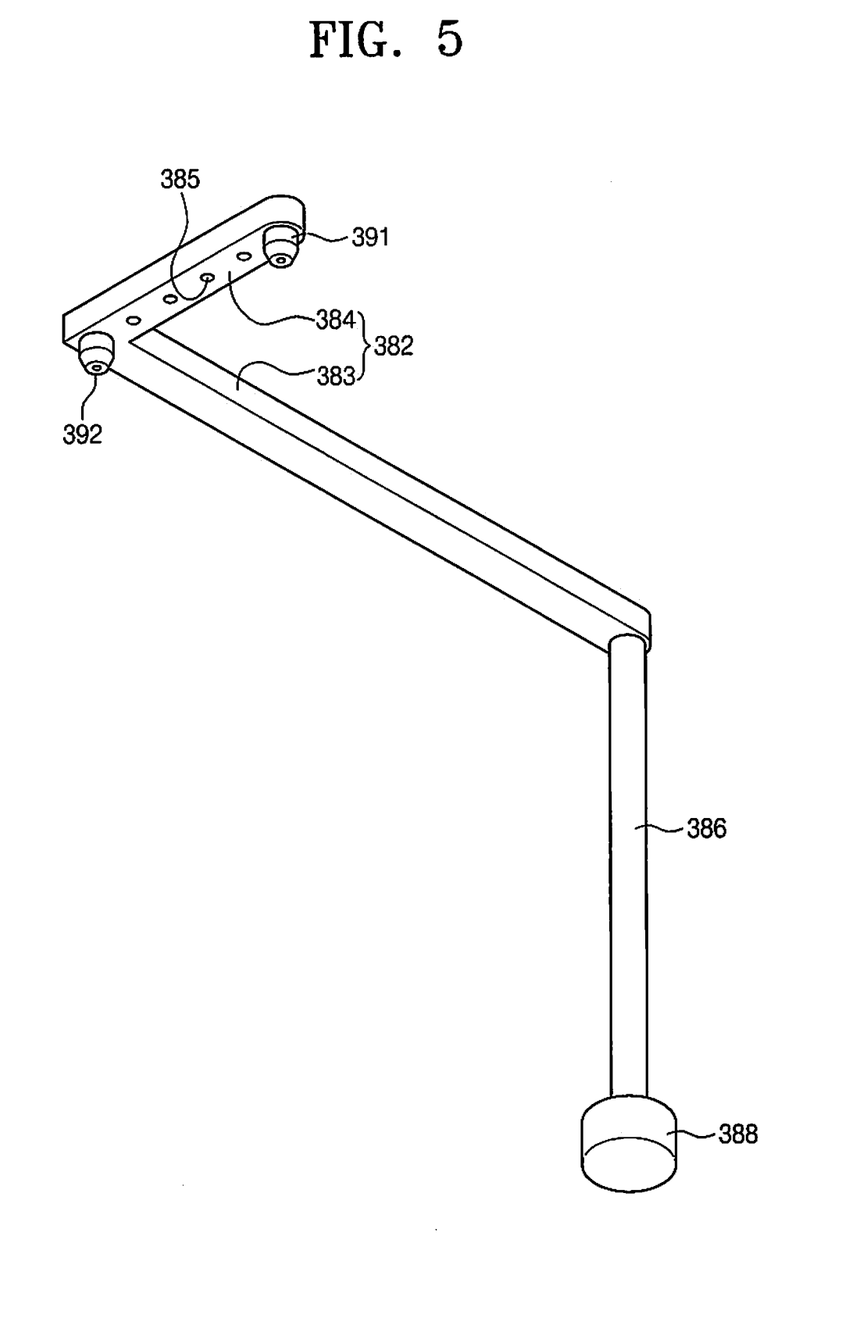
FIG. 5 is a perspective view illustrating a solution supplying unit of FIG. 3.

The solution supplying unit 380 may supply a treatment solution onto the substrate W. The solution supplying unit 380 may include a nozzle moving member 381, a first nozzle 391, and a second nozzle 392. Each of the nozzles 391 and 392 may be moved to a process or waiting position by the nozzle moving member 381. Here, at the process position, the nozzles 391 and 392 may be located to face the substrate W loaded on the spin head 340, and at the waiting position, the nozzles 391 and 392 may be located away from the process position. The nozzle moving member 381 may include a rotating axis 386, a driving unit 388, and a supporting arm 382. The rotating axis 386 may be disposed at a side of the treatment vessel 320. The rotating axis 386 may have a rod-shape structure and may have a longitudinal direction parallel to the third direction 16. The rotating axis 386 may be rotated by the driving unit 388. For example, the rotating axis 386 may be rotated about its central axis by a driving force exerted from the driving unit 388. The supporting arm 382 may connect the nozzles 391 and 392 to the rotating axis 386. As a result of the rotation of the rotating axis 386, the supporting arm 382 and the nozzles 391 and 392 may be rotated about the central axis of the rotating axis 386. The rotation of the rotating axis 386 may make it possible to move the nozzle between the process and waiting positions.

Figure 4:
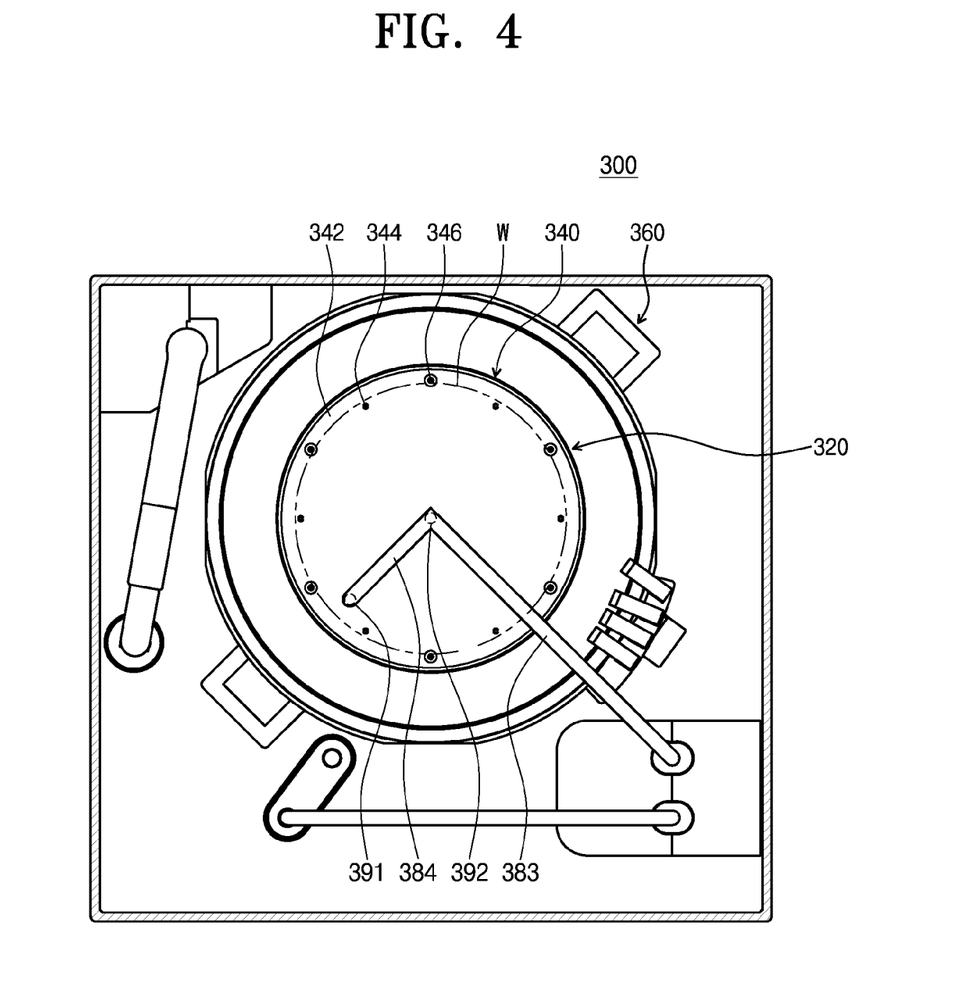
FIG. 4 is a plan view illustrating the substrate treating apparatus of FIG. 2.

The supporting arm 382 may include a first arm 383 and a second arm 384. The first arm 383 may have a rod-shaped structure and may have a longitudinal direction perpendicular to the third direction 16. Accordingly, the first arm 383 may be provided to have a longitudinal direction parallel to a horizontal plane. The first arm 383 may include an end portion fixedly coupled to a top portion of the rotating axis 386. An opposite end portion of the first arm 383 may be rotatable about the end portion thereof. In some embodiments, when viewed in a plan view, the first arm 383 may be provided in such a way that the moving path of the opposite end portion thereof passes over the center region of the substrate W. The second arm 384 may extend from the opposite end portion of the first arm 383 and may have a rod-shaped structure. When viewed in a plan view, the second arm 384 may have a longitudinal direction different from that of the first arm 383. For example, the second arm 384 may extend from the opposite end portion of the first arm 383 in a direction different from that of the first arm 383. Accordingly, when viewed in a plan view, the supporting arm 382 may have an inverted "L" shape. When viewed in a plan view, the second arm 384 may have a length that is equal to or longer than a radius of the substrate W. In some embodiments, the length of the second arm 384 may be equal to the radius of the substrate W. The first and second nozzles 391 and 392 may be connected to the second arm 384. Each of the first and second nozzles 391 and 392 may be fixedly coupled to a bottom surface of the second arm 384. Accordingly, the first and second nozzles 391 and 392 may move together.

The first and second nozzles 391 and 392 may be configured to supply treatment solutions different from each other. For example, the first nozzle 391 may supply a first treatment solution, and the second treatment solution may supply a second treatment solution. In some embodiments, the first treatment solution may contain chemical for etching a layer formed on the substrate W, and the second treatment solution may be an etch prevention solution (EPS) for diluting the first treatment solution. As an example, the first treatment solution may be a strong acid solution (e.g., hydrofluoric acid (HF) or phosphoric acid ($P_2O_5$), and the second treatment solution may be a deionized water. In certain embodiments, the second treatment solution may contain an inert gas. The first nozzle 391 may be used to supply an etching solution, and the second nozzle 392 may be used to supply the EPS. When viewed in a plan view, the first and second nozzles 391 and 392 may be spaced apart from each other in the longitudinal direction of the second arm 384. In some embodiments, when viewed in a plan view, a distance between the first and second nozzles 391 and 392 may correspond or equal to the radius of the substrate W. The process position of the first nozzle 391 may be a position facing an edge region of the substrate W, and the process position of the second nozzle 392 may be a position facing the center region of the substrate W.

In certain embodiments, the second arm 384 may be upwardly or downwardly inclined in a direction away from the first arm 383.

Hereinafter, a process of treating the substrate W using the substrate treating apparatus 300 will be described. In the case where the substrate W is loaded on the spin head 340, each of the first and second nozzles 391 and 392 may be moved to its process position and the substrate W may be rotated. The second nozzle 392 may be configured to supply the second treatment solution on the center region of the substrate W. The second treatment solution may be spread over the entire region of the substrate W using a centrifugal force to form a liquid film on the substrate W. The first nozzle 391 may be configured to supply the first treatment solution on the substrate W covered with the liquid film. As an example, the first nozzle 391 may supply the first treatment solution on the edge region of the substrate W. As a result, a layer formed on the edge region of the substrate W may be etched. When the process of etching the substrate W is finished, the supply of the first treatment solution through the first nozzle 391 may be interrupted. Thereafter, the supply of the second treatment solution through the second nozzle 392 may also be interrupted.

According to the afore-described embodiments, during the process of etching the edge region of the substrate W, the second treatment solution may be supplied on the center region of the substrate W. This may make it possible to prevent the center region from being dried during the substrate treating process.

Furthermore, the liquid film made of the second treatment solution may be formed on the center region of the substrate W, and this may make it possible to prevent the center region of the substrate W from being etched, even when the first treatment solution is partially scattered to the center region.

According to the afore-described embodiments, the first and second nozzles 391 and 392 may be fixedly coupled to the second arm 384. However, in certain embodiments, a plurality of connection ports 385 may be provided in the second arm 384. The connection ports 385 may be arranged along the longitudinal direction of the second arm 384. Each of the first and second nozzles 391 and 392 may be coupled to a corresponding one of the connection ports 385. This may make it possible to change a space between the first nozzle 391 and the second nozzle 392.

Figure 6:
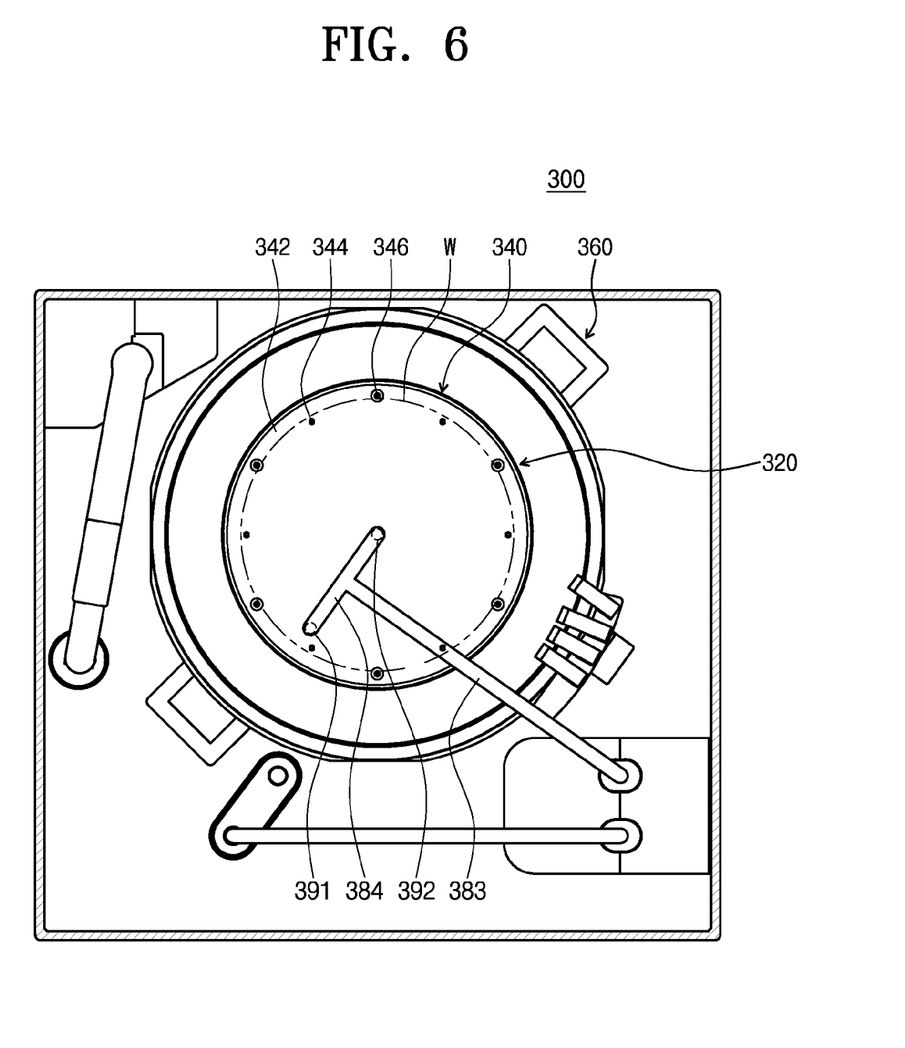
FIG. 6 is a plan view illustrating another example of a solution supplying unit of FIG. 4.

Hereinafter, another example of the solution supplying unit 380 will be described. FIG. 6 is a plan view illustrating another example of a solution supplying unit of FIG. 4. Referring to FIG. 6, the second arm 384 may extend from the opposite end portion of the first arm 383 in such a way that the supporting arm 382 has a "T" shape, when viewed in a plan view. The second arm 384 may be provided in such a way that a center region thereof is connected to the opposite end portion of the first arm 383. The first and second nozzles 391 and 392 may be respectively provided at both end portions of the second arm 384.

Figure 7:
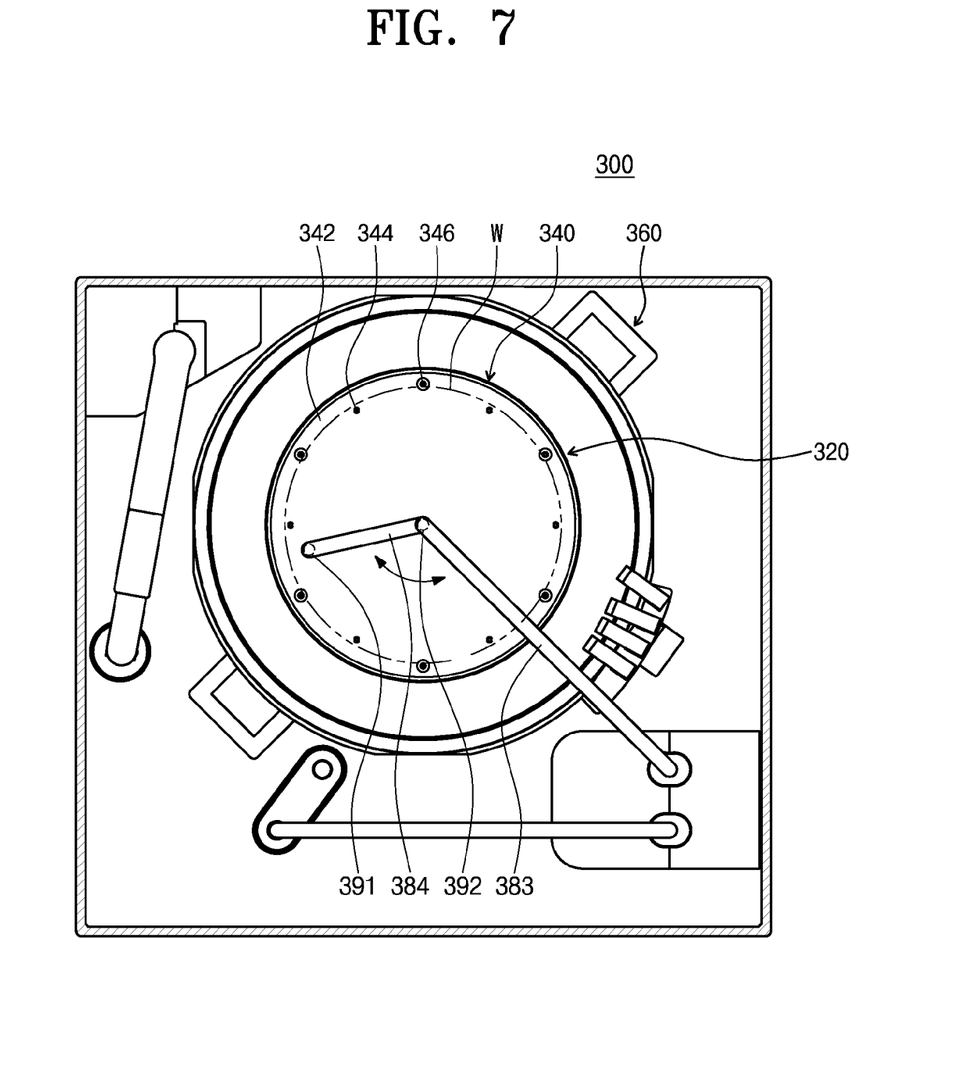
FIG. 7 is a plan view illustrating other example of the solution supplying unit of FIG. 4.

According to other example of the solution supplying unit 380, the second arm 384 may be fixedly coupled to a bottom surface of the opposite end portion of the first arm 383. FIG. 7 is a plan view illustrating other example of the solution supplying unit of FIG. 4. Referring to FIG. 7, the second arm 384 may be configured in such a way that its position relative to the first arm 383 can be changed. The second arm 384 may be rotated about an end portion of the first arm 383 coupled with the second arm 384. Accordingly, it is possible to rotate the first arm 383 about the rotating axis 386, and it is possible to rotate the second arm 384 not only about the rotating axis 386 but also about the opposite end portion of the second arm 384.

Figure 8:
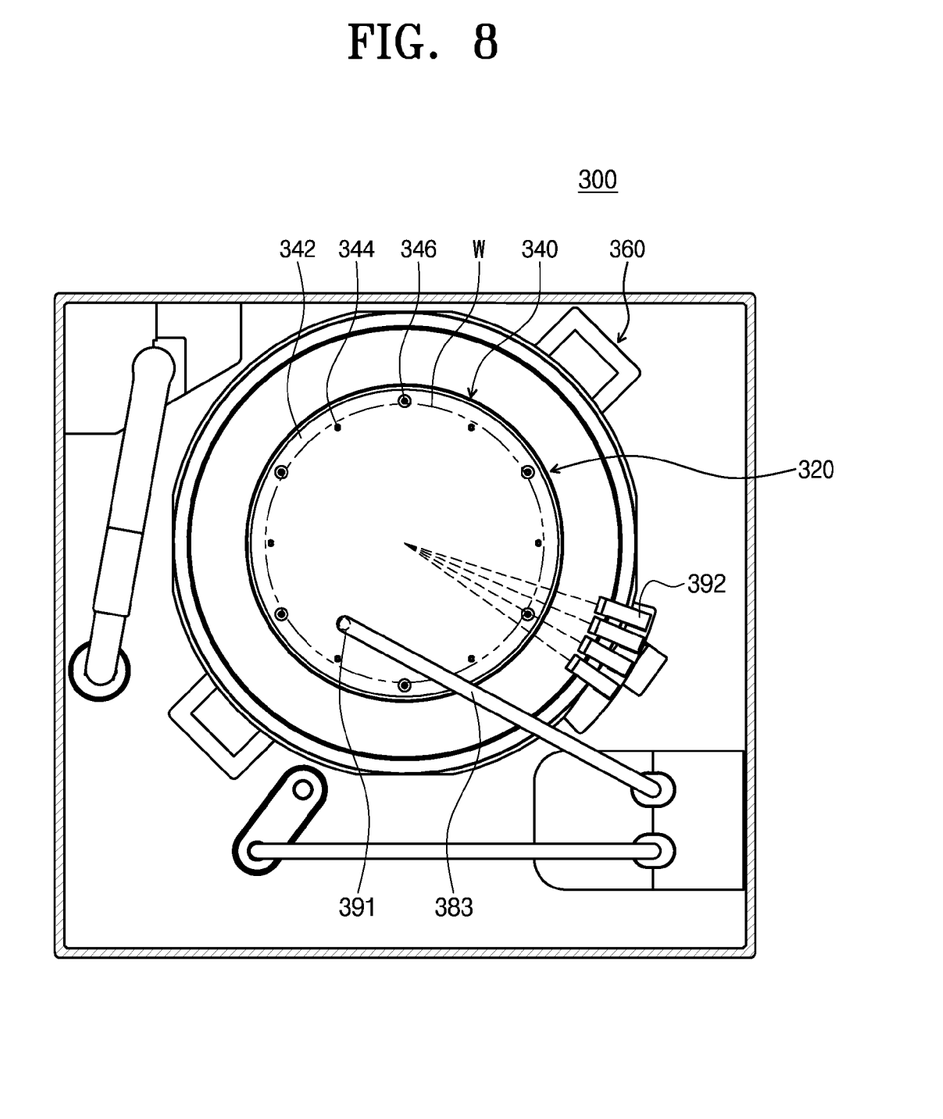
FIG. 8 is a plan view illustrating still other example of the solution supplying unit of FIG. 4.

According to still other example of the solution supplying unit 380, the supporting arm 382 may have a bar-shaped structure and may have a longitudinal direction parallel to a specific direction. FIG. 8 is a plan view illustrating still other example of the solution supplying unit of FIG. 4. Referring to FIG. 8, the first nozzle 391 may be fixedly coupled to the supporting arm 382 but may be configured to be movable between the process and waiting positions, whereas the second nozzle 392 may be fixedly coupled to an upper portion of the treatment vessel and may be unmovable. Here, the second nozzle 392 may be configured to allow an operator to control a flow rate and an ejection angle of the second treatment solution supplied therethrough, and this may make it possible to supply the second treatment solution to the center region of the substrate W.

Figure 9:
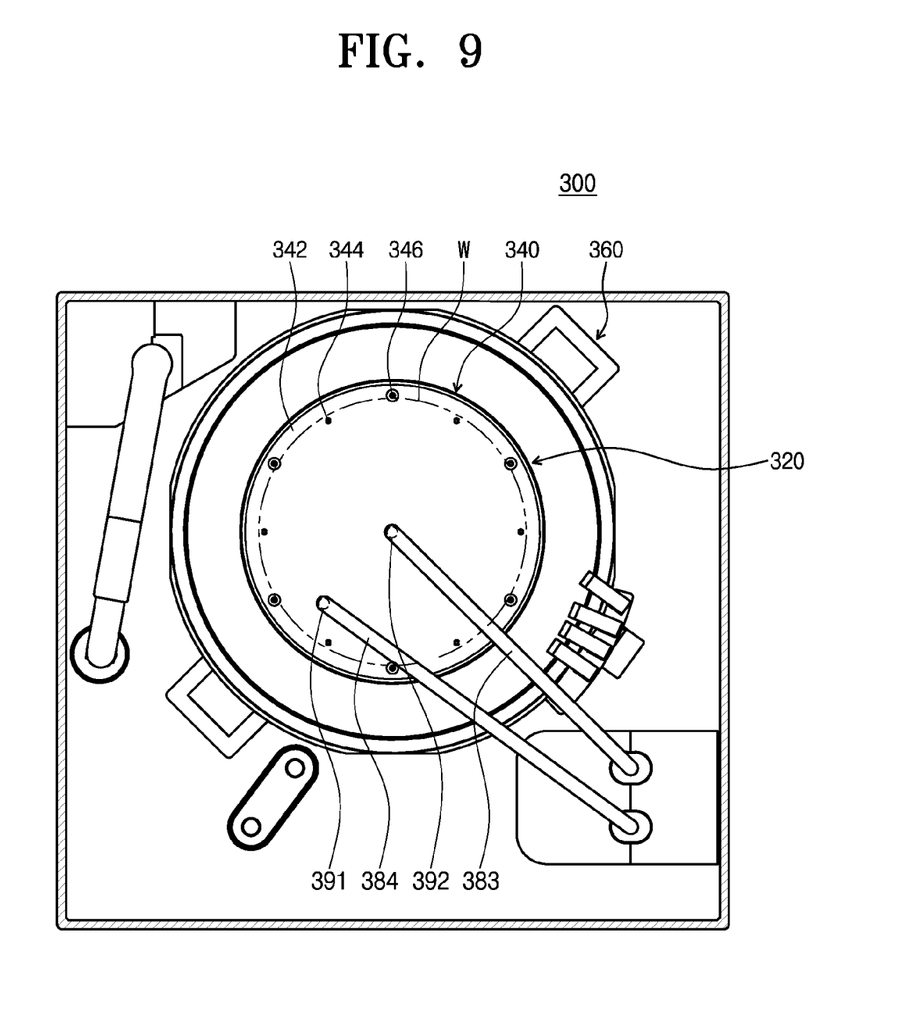
FIG. 9 is a plan view illustrating even other example of the solution supplying unit of FIG. 4.

According to even other example of the solution supplying unit 380, the substrate treating apparatus 300 may include at least two nozzle moving members 381. FIG. 9 is a plan view illustrating even other example of the solution supplying unit of FIG. 4. For example, as shown in FIG. 9, the substrate treating apparatus 300 may include two nozzle moving members 381a and 381b provided with the first and second nozzles 391 and 392, respectively. Each of the nozzle moving members 381a and 381b may include the supporting arm 382, which has a bar-shaped structure and has a longitudinal direction parallel to a specific direction.

According to example embodiments of the inventive concept, during supplying an etching solution on an edge region of a substrate, an etch prevention solution may be supplied on a center region of the substrate. Accordingly, it is possible to prevent the center region of the substrate from being dried.

According to other example embodiments of the inventive concept, it is possible to prevent the center region of the substrate from being etched by an etching solution scattered from the edge region of the substrate.

While example embodiments of the inventive concepts have been particularly shown and described, it will be understood by one of ordinary skill in the art that variations in form and detail may be made therein without departing from the spirit and scope of the attached claims.

What is claimed is:
1. A substrate treating apparatus, comprising:
   a treatment vessel having a treatment space therein;
   a substrate supporting device in the treatment vessel, the substrate supporting device configured to support a substrate; and a solution supplying device configured to supply a treatment solution on the substrate supported by the substrate supporting unit, the solution supplying device including,
 an etching solution supplying nozzle configured to supply an etching solution on an edge region of the substrate supported by the substrate supporting device,
 an etch prevention solution (EPS) supplying nozzle configured to supply an etch prevention solution on a center region of the substrate supported by the substrate supporting device;
a rotating axis;
a driving unit configured to rotate the rotating axis; and
a supporting arm configured to support the etching solution supplying nozzle and the EPS supplying nozzle, the supporting arm including,
 a first arm coupled to the rotating axis, the first arm having a longitudinal direction that is parallel to a specific direction, and
 a second arm coupled to the first arm, the second arm having a longitudinal direction that is different from the specific direction, in a plan view, the etching solution supplying nozzle and the EPS supplying nozzle being provided on the second arm, the second arm being fixed at 90 degrees with respect to the first arm such that a junction therebetween corresponds to the center region of the substrate, and wherein
  the substrate treating apparatus first supplies, via the etching solution supplying nozzle, the etch prevention solution on the center region of the substrate and thereafter subsequently supplies, via the etching solution supplying nozzle, the etching solution on the edge region of the substrate such that the center region of the substrate is pre-treated with the etch prevention solution prior to applying the etching solution to the substrate.

2. The apparatus of claim 1, wherein the second arm has a plurality of connection ports that allows the etching solution supplying nozzle and the EPS supplying nozzle to be connected thereto, and
 the connection ports are arranged along the longitudinal direction of the second arm.

3. The apparatus of claim 1, wherein the second arm is movable relative to the first arm.

4. The apparatus of claim 1, wherein the etch prevention solution (EPS) supplying nozzle is configured to,
 supply the etch prevention solution on the center region of the substrate before the etching solution supplying nozzle supplies the etching solution on the edge region of the substrate such that the center region of the substrate is pre-treated by a layer is formed on the substrate prior to the etching solution being supplied on the edge region of the substrate, and
 supply the etch prevention solution on the center region of the substrate at a same time as the etching solution supplying nozzle supplies the etching solution on the edge region of the substrate after the center region of the substrate is pre-treated.

5. The apparatus of claim 1, wherein the first arm includes a first end and a second end, the first end of the first arm being coupled to the rotating axis, and the second end of the first arm being coupled to the second arm.

* * * * *